(12) United States Patent
Whetsel

(10) Patent No.: US 6,763,488 B2
(45) Date of Patent: Jul. 13, 2004

(54) GENERATOR/COMPACTOR SCAN CIRCUIT LOW POWER ADAPTER WITH COUNTER

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 470 days.

(21) Appl. No.: 09/803,608

(22) Filed: Mar. 9, 2001

(65) Prior Publication Data

US 2002/0112199 A1 Aug. 15, 2002

Related U.S. Application Data

(60) Provisional application No. 60/188,109, filed on Mar. 9, 2000.

(51) Int. Cl.[7] .................... G01R 31/28; G01R 31/3183
(52) U.S. Cl. ....................................... 714/729; 714/738
(58) Field of Search ............................... 714/724, 726, 714/729, 741, 738

(56) References Cited

U.S. PATENT DOCUMENTS

| 6,158,032 A | * | 12/2000 | Currier et al. ............... 714/726 |
| 6,316,959 B1 | * | 11/2001 | Onodera ....................... 326/46 |
| 6,327,685 B1 | * | 12/2001 | Koprowski et al. .......... 714/733 |
| 6,594,802 B1 | * | 7/2003 | Ricchetti et al. ................ 716/4 |

* cited by examiner

Primary Examiner—Albert Decady
Assistant Examiner—Cynthia Britt
(74) Attorney, Agent, or Firm—Lawrence J. Bassuk; W. James Brady; Frederick J. Telecky, Jr.

(57) ABSTRACT

A Scan-BIST architecture is adapted into a low power Scan-BIST architecture. A generator 102, compactor 106, and controller 110 remain the same as in the known art. The changes between the known art Scan-BIST architecture and the low power Scan-BIST architecture involve modification of the known scan path into scan path 502, to insert scan paths A 506, B 508 and C 510, and the insertion of an adaptor circuit 504 in the control path 114 between controller 110 and scan path 502.

5 Claims, 7 Drawing Sheets

GENERATOR/COMPACTOR SCAN CIRCUIT LOW POWER ADAPTER WITH COUNTER

This application claims priority under 35 USC §119(e)(1) of provisional application No. 60/188,109, filed Mar. 9, 2000.

This disclosure relates to and incorporates by reference U.S. Pat. No. 6,519,729, and U.S. Patent Application Publication 2001/0,047,498.

BACKGROUND OF THE INVENTION

1. Field of the Invention

Scan-BIST architectures are commonly used to test digital circuitry in integrated circuits. The present invention describes a method of adapting conventional Scan-BIST architectures into low power Scan-BIST architectures.

2. Description of the Related Art

FIG. 1 illustrates a conventional Scan-BIST architecture that a circuit 100 can be configured into during test. In the normal functional configuration, circuit 100 may be a functional sub-circuit within IC, but in test configuration it appears as shown in FIG. 1. The Scan-BIST architecture is typically realized within a sub-circuit of an IC, such as an intellectual property core DSP or CPU sub-circuit. The Scan-BIST architecture includes a generator circuit 102, compactor circuit 106, scan path circuit 104, logic circuitry to be tested 108, and controller circuit 110. Generator 102 operates to produce and output serial test stimulus patterns to scan path 104 via path 118. Compactor 106 operates to input and compress serial test response patterns from scan path 104 via path 120. Scan path 104 operates, in addition to its serial input and output modes, to output parallel test stimulus patterns to logic 108 via path 122, and input parallel response patterns from logic 108 via path 124. Controller 110 operates to produce and output the control required to operate generator 102 via path 112, scan path 104 via path 114, and compactor 106 via path 116. Generator 102 may be designed using any suitable type of circuit for producing stimulus patterns, such as linear feedback shift registers. Compactor 106 may be designed using any suitable type of circuit for compacting response patterns into signatures, such as signature analysis registers. Controller 110 may be designed using any suitable type of controller or state machine designed to autonomously operate generator 102, scan path 104, and compactor 106 during test.

The circuit of FIG. 1 may be configured into the illustrated Scan-BIST architecture and enabled to start a test operation in response to a variety of methods, including; (1) in response to power up of the circuit, (2) in response to manipulation of external inputs to the circuit, or (3) in response to data loaded into a register, such as the IEEE 1149.1 TAP instruction register.

FIG. 2 illustrates an example of a conventional scan cell that could be used in scan path 104. (Note: The optional scan cell multiplexer 218 and connection paths 220 and 224, shown in dotted line, will not be discussed at this time, but will be discussed later in regard to FIGS. 7 and 8.) The scan cell consists of a D-FF 204 and a multiplexer 202. During normal configuration of the circuit 100, multiplexer 202 and D-FF 204 receive control inputs SCANENA 210 and SCANCK 212 to input and output functional data to logic 108 via paths 206 and 216, respectively. In the normal configuration, the SCANCK to D-FF 204 is typically a functional clock, and the SCANENA signal is set such that the D-FF always clocks in functional data from logic 108 via path 206. During the test configuration of FIG. 2, multiplexer 202 and D-FF 204 receive control inputs SCANENA 210 and SCANCK 212 to capture test response data from logic 108 via path 206, shift data from scan input path 208 to scan output path 214, and apply test stimulus data to logic 108 via path 216. In the test configuration, the SCANCK to D-FF 204 is the test clock and the SCANENA signal is operated to allow capturing of response data from logic 108 and shifting of data from scan input 208 to scan output 214. During test configuration, SCANENA is controlled by controller 110. SCANCK may also be controlled by the controller, or it may be controlled by another source, for example the functional clock source. For the purpose of simplifying the operational description, it will be assumed that the SCANCK is controlled by the controller.

The scan inputs 208 and scan outputs 214 of multiple scan cells are connected to form the serial scan path 104. The stimulus path 216 and response path 206 of multiple scan cells in scan path 104 form the stimulus bussing path 122 and response bussing path 124, respectively, between scan path 104 and logic 108. From this scan cell description, it is seen that the D-FF is shared between being used in the normal functional configuration and the test configuration. During scan operations through scan path 104, the stimulus outputs 216 from each scan cell ripple, since the stimulus 216 path is connected to the scan output path 214. This ripple causes all the inputs to logic 108 to actively change state during scan operations. Rippling the inputs to logic 108 causes power to be consumed by the interconnect and gating capacitance in logic 108.

FIG. 3 illustrates a simplified example of the operation 300 of controller 110 during test. Initially the controller will be in an idle 302 or non-operational state. In response to a start test operation input, for example using one of the methods mentioned above, the controller transitions from the idle state to the operate state 304. In the operate state, the controller issues control to the generator, scan path, and compactor. In response to the control, the generator begins producing stimulus data to the scan path, the scan path begins accepting the stimulus data and outputting response data, and the compactor begins inputting and compressing the response data from the scan path. The controller remains in the operate state until the scan path has been filled with stimulus data and emptied of response data. From the operate state, the controller passes through the capture state 306 to load response data from the logic 108, then re-enters the operate state. Since the initial response data from the scan path may be unknown, unless for example the scan path is initialized at the beginning of the test, the response data input to the compactor may be delayed or masked off until after the controller has passed through the capture state 206 a first time. The process of entering the operate state to load stimulus into the scan path and empty response from the scan path, then passing through the capture state to load new response data repeats until the end of test. At end of test the controller re-enters the idle state. Upon re-entering the idle state, the controller may output an end of test (EOT) signal 111 to indicate test completion. The compactor may be designed to include an expected response signature value that is compared against the signature obtained from the test. If so, the compactor will typically output a PASS/FAIL signal 117 at end of test to indicate whether the signature taken matched the expected signature. The use of EOT and PASS/FAIL signals are assumed in subsequent Figures, but will not be shown.

FIG. 4 illustrates a timing example of how controller 110 outputs SCANENA and SCANCK signals to scan path 104 during scan operations. In this example, a high to low transition on SCANENA, at time 406, in combination with SCANCKs occurring during time interval 402, causes stimulus data from generator 102 to be input to the scan path while response data is output to compactor 106. A low to high transition on SCANENA, at time 408, in combination with a SCANCK at time 404, causes response data from logic 108 to be loaded into the scan path. Time interval 402 relates to operate state 304 and time interval 404 relates to capture state 306 of FIG. 3. As seen in the timing and operation diagrams of FIGS. 3 and 4, the time interval sequences 404 (i.e. state 306) and 402 (i.e. state 304) cycle a sufficient number of times during test to input all stimulus to and obtain all response from logic 108.

From the Scan-BIST architecture described in regard to FIGS. 1, 2, 3, and 4 it is seen that the stimulus 122 outputs ripple the inputs to logic 108 as data shifts through the scan path 104 during scan operations. Rippling the inputs of logic 108 causes simultaneous charging and discharging of capacitance's associated with the interconnects and gates of logic 108. For example, each scan cell stimulus output 216 to logic 108 charges and discharges a certain amount of capacitance within logic 108 at a frequency related to the data bits being scanned through the scan cell. While each scan cell stimulus output may only be directly input to a few gates within logic 108, each of the gates have outputs that fanout to inputs of other gates, and the outputs of the other gates again fanout to inputs of still further gates, and so on. Thus a transition on the stimulus output of a single scan cell may initiate hundreds of transitions within logic 108 as a result of the signal transition fanout.

The individual power (Pi) consumed by the rippling of a given scan cell output 216 can be approximated by $CV^2F$, where C is the capacitance being charged or discharged by the scan cell output (i.e. the capacitance of the above mentioned signal transition fanout), V is the switching voltage level, and F is the switching frequency of the scan cell output. The total power (Pt) consumed by simultaneously scanning all the scan cells in scan path 104 is approximately the sum of the individual scan cell powers, i.e. $Pt=Pi_1+Pi_2+ \ldots Pi_N$. The total power consumed by circuit 100 when it is configured into the Scan-BIST architecture of FIG. 1 can exceed the power consumed by circuit 100 when it is configured into its normal functional mode. This can be understood from the fact that, during normal functional mode of circuit 100, not all the D-FFs 204 simultaneously operate, as they do during scan operations occurring during the above described Scan-BIST test operation. Further, if an IC contained multiple circuits 100, the test of the IC may require testing each circuit 100 individually due to the above described test power consumption restriction. This lengthens the test time of the IC, which increased the cost to manufacture the IC. This also lengthens the powerup-self-test time of ICs in portable, battery operated systems.

A first known method of reducing power consumption during test operation is to insert blocking circuitry, such as a gate, into the stimulus paths 216 of each scan cell, such that during scan operations the inputs to logic 108 are blocked from the effect of the scan ripple. The problem with the first method is that it adds an undesirable delay (i.e. the blocking circuit delay) in the stimulus paths 216 between D-FFs 204 and logic 108. This delay can negatively effect the performance of circuit 100 when it is configured into its normal functional mode. A second known method is to reduce the scan clock rate, such that the ripple frequency (F) is reduced. The problem with the second method is that it increases the test time since scan operations are performed at the reduced scan clock rate.

Today, there are a number of test synthesis vendor tools that can synthesize and insert Scan-BIST architectures into ICs, similar in structure to the Scan-BIST architecture shown in FIG. 1. The use of such "push-button" Scan-BIST insertion tools is an attractive alternative to customized Scan-BIST designs since it is an automated process. As will be described, the present invention provides a method of adapting these synthesized Scan-BIST architectures such that they may operate in a desired low power mode. The process of adapting Scan-BIST architectures for low power operation is also easily automated.

BRIEF SUMMARY OF THE INVENTION

Scan-BIST architectures are commonly used to test digital circuitry in integrated circuits. The present invention describes a method of adapting conventional Scan-BIST architectures into low power Scan-BIST architectures. The low power Scan-BIST architecture maintains the test time of Scan-BIST architectures, while requiring significantly less operational power than conventional Scan-BIST architectures. The low power Scan-BIST architecture is advantageous to IC/die manufacturers since it allows a larger number of circuits (such as DSP or CPU core circuits) embedded in an IC/die to be tested in parallel without consuming too much power within the IC/die. It is also advantageous to designers of portable, battery operated systems, like wireless telephones, since ICs in the systems can be powerup-self-tested by the low power Scan-BIST architecture using only a fraction of the stored battery energy required by conventional scan-BIST architectures.

The present invention described below provides a method of adapting synthesized Scan-BIST architectures to achieve a low power mode of operation. The process of adapting Scan-BIST architectures for low power operation is achieved without having to modify the above mentioned synthesized controller 110, generator 102, or compactor 106. Also, the process of adapting Scan-BIST architectures for low power operation is achieved without the aforementioned problems of; (1) having to insert blocking circuitry in the stimulus paths which adds signal delays, and (2) having to decrease the scan clock rate which increases test time.

A generator 102, compactor 106, and controller 110 remain the same as in the known art. The changes between the known art Scan-BIST architecture and the low power Scan-BIST architecture involve modification of the known scan path into a modified scan path, to insert scan paths A, B and C, and the insertion of an adaptor circuit in the control path 114 between controller 110 and the scan path.

DETAILED DESCRIPTION OF THE INVENTION

Figure 1:
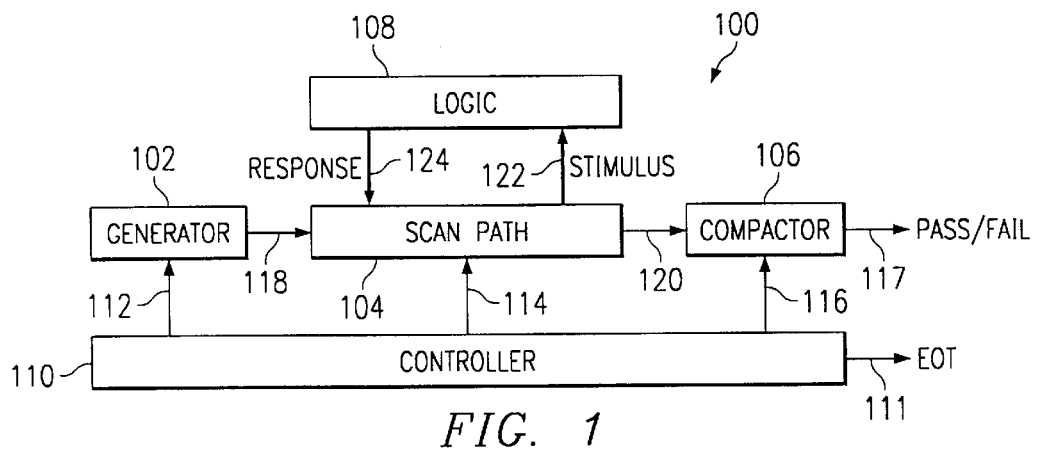
FIG. 1 is a block diagram of a SCAN-BIST circuit having a single scan path.
Figure 5:
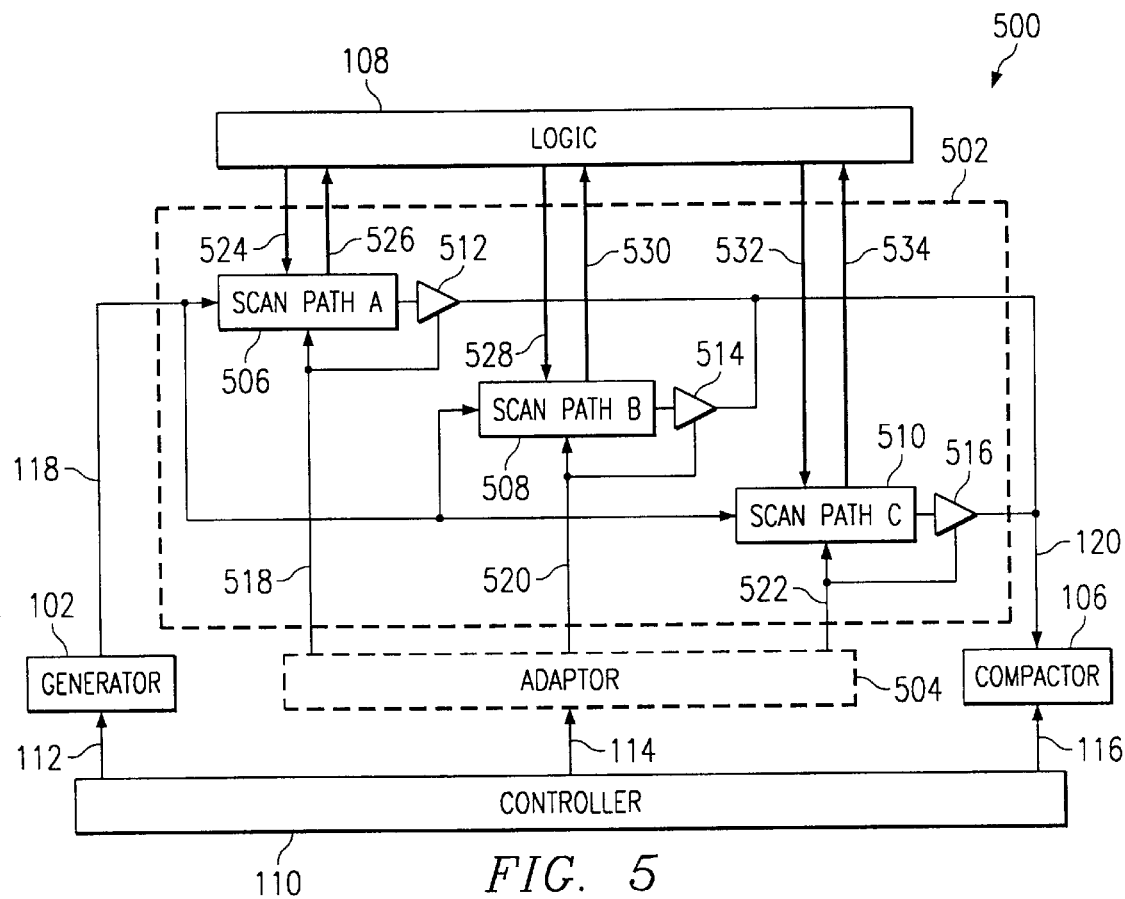
FIG. 5 is a block diagram of a SCAN-BIST circuit having a scan path arranged according to the present invention.

FIG. 5 illustrates the Scan-BIST architecture of FIG. 1 after it has been adapted into the low power Scan-BIST architecture of the present invention. In FIG. 5, it is seen that the generator 102, compactor 106, and controller 110 remain the same as in FIG. 1. The changes between the FIG. 1 Scan-BIST architecture and the FIG. 5 low power Scan-BIST architecture involve modification of scan path 104 into scan path 502, and the insertion of an adaptor circuit 504 in the control path 114 between controller 110 and scan path 502.

Adapting scan path 104 into scan path 502 involves reorganizing scan path 104 from being a single scan path containing all the scan cells (M), into a scan path having a desired number of selectable separate scan paths. In FIG. 5, scan path 502 is shown after having been reorganized into three separate scan paths A, B, and C 506–510. It is assumed at this point in the description that the number of scan cells (M) in scan path 104 is divisible by three such that each of the three separate scan paths A, B, and C contains an equal number of scan cells (M/3). The case where scan path 104 contains a number of scan cells (M) which, when divided by the number of desired separate scan paths, does not produce an equal number of scan cells in each separate scan path will be discussed later in regard to FIG. 9.

Scan paths A, B, and C are configured as follows inside scan path 502. The serial input of each scan path A, B, and C is commonly connected to the generator 102 via connection 118. The serial output of scan path A is connected to the input of a 3-state buffer 512, the serial output of scan path B is connected to the input of a 3-state buffer 514, and the serial output of scan path C is connected to the input of a 3-state buffer 516. The outputs of the 3-state buffers 512–516 are commonly connected to compactor 106 via connection 120. Scan paths A, B, and C each output an equal number of parallel stimulus inputs 526, 530, 534 to logic 108, and each input an equal number of parallel response outputs 524, 528, 532 from logic 108. The number of stimulus output signals to logic 108 in FIGS. 1 and 5 is the same. The number of response input signals from logic 108 in FIGS. 1 and 5 is the same. Scan path A and buffer 512 receive control input from adaptor 504 via bus 518, scan path B and buffer 514 receive control input from adaptor 504 via bus 520, and scan path C and buffer 516 receive control input from adaptor 504 via bus 522.

Adaptor 504 is connected to scan paths A,B,C via busses 518–522 and to controller 110 via bus 114. The purpose of the adaptor is to intercept the scan control output 114 from controller 110 and translate it into a sequence of separate scan control outputs 518–522 to scan paths A, B, and C, respectively. Each of the separate scan control outputs 518–522 are used to operate one of the scan paths A, B, and C.

Figure 3:
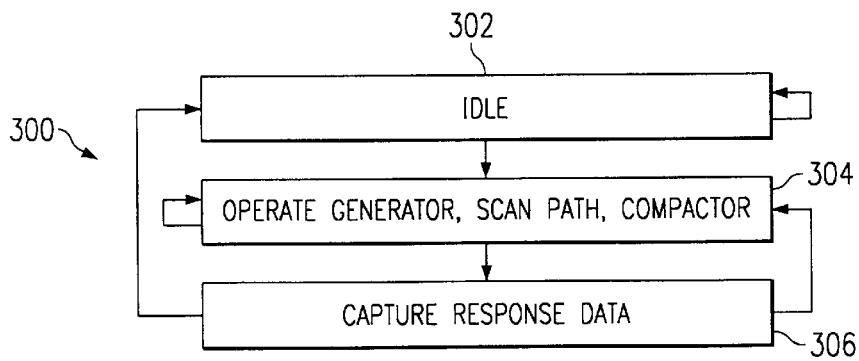
FIG. 3 is a flow diagram of the operation of the circuit of FIG. 1.
Figure 6:
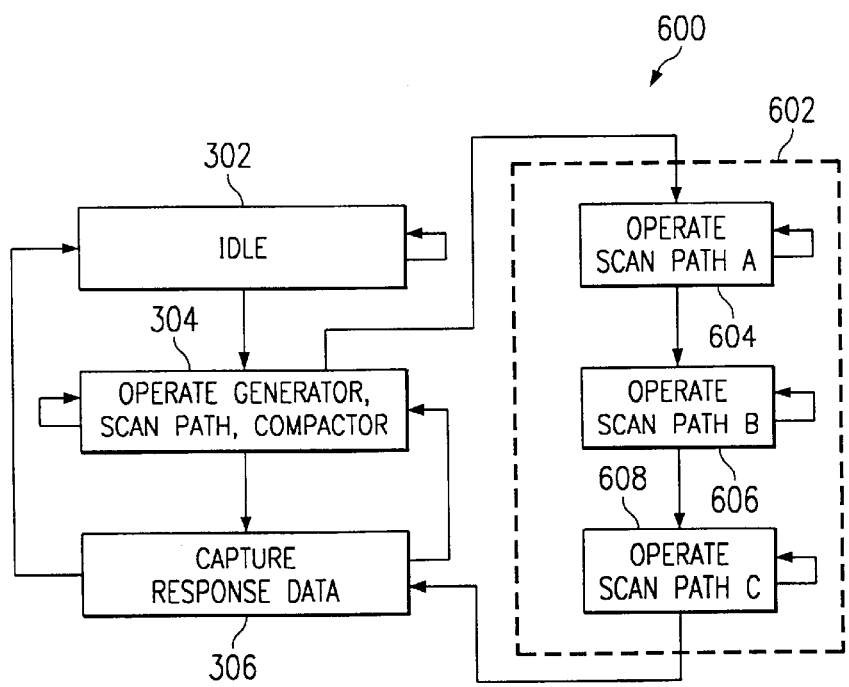
FIG. 6 is a flow diagram of the operation of the circuit of FIG. 5.

FIG. 6 illustrates a simplified example of the combined operation 600 of the controller 110 and adaptor 504 during test. The operation of controller 110 is the same as previously described in regard to FIG. 3. When the controller transitions to the operate state 304, it begins outputting control to the generator 102, adaptor 504, and compactor 106. The generator and compactor responds to the control input as previously described in regard to FIGS. 1 and 3. The adaptor responds to the control input by translating it into a sequence of separate control outputs 518, 520, and 522 to scan paths A, B, and C. As indicated in adaptor operation block 602, the adaptor first responds to control 114 during adaptor operation state 604 to output control 518, which enables buffer 512 and operates scan path A to input stimulus data from generator 102 and output response data to compactor 106. After scan path A is filled with stimulus and emptied of response, adaptor 504 responds to control 114 during operation state 606 to output control 520, which enables buffer 514 and operates scan path B to input stimulus data from generator 102 and output response data to compactor 106. After scan path B is filled with stimulus and emptied of response, adaptor 504 responds to control 114 during operation state 608 to output control 522, which enables buffer 516 and operates scan path C to input stimulus data from generator 102 and output response data to compactor 106. After scan paths A, B, and C have been filled and emptied, the controller 110 transitions from the operate state 304, through the capture state 306, and back to the operate state 304. During this transition, the adaptor is idle during the capture state 306, but resumes its scan control sequencing operation when the operate state 304 is re-entered. This process of sequentially scanning scan paths A, B, and C, then performing a capture operation to load response data repeats until the test has been performed and controller 110 enters the idle state 302.

During the sequencing of the operation states 604–608, only one of the buffers 512–516 are enabled at a time to output response data to compactor 106. Also, the sequencing of the adaptor operation states 604–608 occurs in a seamless manner such that the stimulus data from the generator 102 is input to scan path 502 as it was input to scan path 104, and the response data to compactor 106 is output from scan path 502 as it was output from scan path 104. To the controller, generator, and compactor, the behavior of the scan path 502 and adaptor 504 combination is indistinguishable from the behavior of the scan path 104 in FIG. 1. Thus the test time of the logic 108 in FIG. 5 is the same as the test time of logic 108 in FIG. 1.

From the above description, it is seen that only a subset (i.e. subset A 526, B 530, or C 534) of the stimulus input bus 122 to logic 108 is allowed to ripple at any given time during the adaptor operated scan operation of FIGS. 5 and 6. In contrast, the entire stimulus input bus 122 to logic 108 ripples during the controller operated scan operation of FIGS. 1 and 3. Since, using the present invention, only a subset of the stimulus inputs to logic 108 are allowed to ripple at any one time, less of the aforementioned interconnect and gating capacitance of logic 108 is simultaneously charged and discharged during scan operations. By reducing the amount of logic 108 capacitance being simultaneously charged and discharged during scan operations, the power consumed by logic 108 is advantageously reduced by the present invention.

Example Adaptor Circuit

Figure 2:
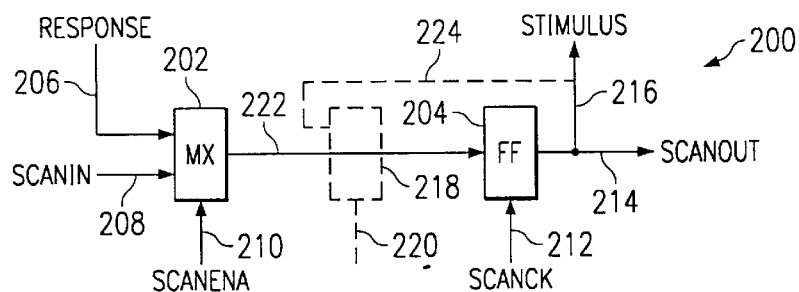
FIG. 2 is a block diagram of a scan cell.
Figure 7:
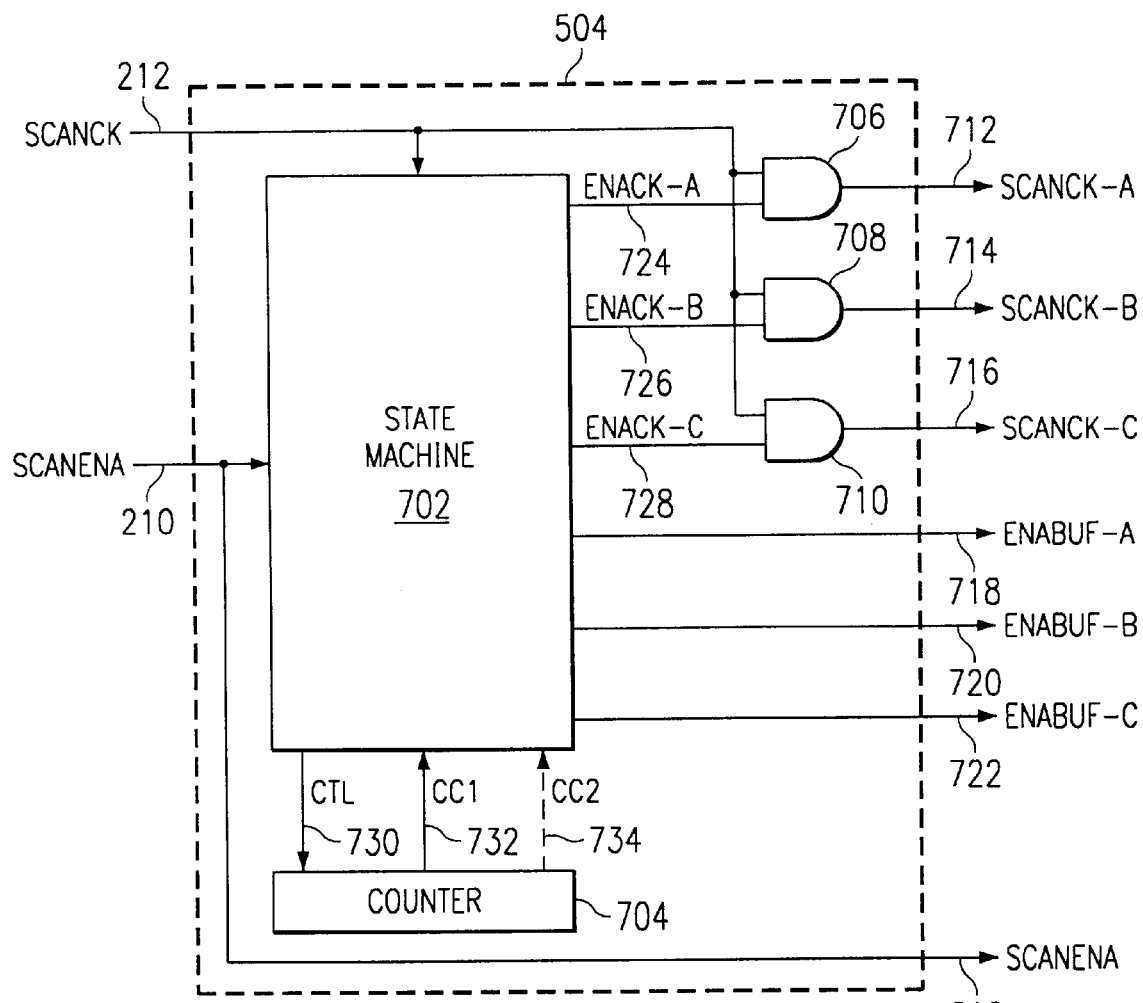
FIG. 7 is a block diagram of the adaptor of FIG. 5.

FIG. 7 illustrates an example adaptor circuit 504 implementation. Adaptor 504 inputs the SCANCK 212 and SCANENA 210 signals from controller 110, via bus 114. Adaptor 504 outputs SCANCK-A signal 712, SCANCK-B signal 714, SCANCK-C signal 716, ENABUF-A signal 718, ENABUF-B signal 720, ENABUF-C signal 722, and the SCANENA signal 210. The SCANENA signal 210 is connected to all scan cell 200 multiplexers 202 as shown in FIG. 2. The SCANCK-A signal 712 is connected, in substitution of SCANCK signal 212, to all scan cell 200 D-FF 204 clock inputs of scan path A. The SCANCK-B signal 714 is connected, in substitution of SCANCK signal 212, to all scan cell 200 D-FF 204 clock inputs of scan path B. The SCANCK-C signal 716 is connected, in substitution of SCANCK signal 212, to all scan cell 200 D-FF 204 clock inputs of scan path C. The ENABUF-A signal 718 is connected to the enable input of buffer 512. The ENABUF-B signal 720 is connected to the enable input of buffer 514. The ENABUF-C signal 722 is connected to the enable input of buffer 516.

Adaptor 504 includes a state machine 702, counter 704, and gates 706–710. During functional mode of circuit 500, SCANENA is high as indicated at time 810 in the adaptor timing diagram of FIG. 8. While SCANENA is high, state machine 702 outputs control signals 724–728 that enable SCANCK to pass through gates 706–710 to functionally clock all D-FFs 204 of scan paths A, B, and C, via SCANCK-A, SCANCK-B, and SCANCK-C. In this example, the SCANCK is assumed to be the functional clock during the functional mode of circuit 500, and the test clock during test mode of circuit 500. While SCANENA is high, state machine 702 outputs control signals 718–722 to disable buffers 512–516. The scan operation mode is entered by SCANENA going low as indicated at time 812 in FIG. 8. SCANENA goes low when controller 110 transitions from the idle state 302 to the operate state 304 as seen in FIG. 6.

At the beginning of the scan operation mode, the state machine initializes counter 704 via control (CTL) signals 730 and disables scan access to scan paths B and C by disabling SCANCK gates 708 and 710 via signals 726 and 728, and enables scan access to scan path A by; (1) enabling SCANCK gate 706 via signal 724, and (2) enabling buffer 512 via signal 718. Scan access of scan path A occurs over time interval 802 of FIG. 8. During time interval 802, scan path A is accessed to load stimulus data from generator 102 and unload response to compactor 106. While scan path A is being accessed, the state machine operates counter 704 via control signals 730 to determine the number (M/3) of SCANCK-A's to output to scan path A. When the counter reaches a count, indicative of scan path A receiving the correct number (M/3) SCANCK-A inputs, it outputs a first count complete 1 (CC1) signal 732 to state machine 702.

In response to the first CC1 signal, the state machine initializes counter 704 via control signals 730 and disables scan access to scan path A and C, and enables scan access to scan path B over time interval 804. The state machine enables scan access to scan path B by; (1) enabling SCANCK gate 708 via signal 726, and (2) enabling buffer 514 via signal 720. While scan path B is being accessed, the state machine operates counter 704 via control signals 730 to determine the number of SCANCK-B's to output to scan path B. When the counter reaches a count, indicative of scan path B receiving the correct number (M/3) SCANCK-B inputs, it outputs a second count complete 1 (CC1) signal 732 to state machine 702.

In response to the second CC1 signal, the state machine initializes counter 704 via control signals 730 and disables scan access to scan path A and B, and enables scan access to scan path C over time interval 806. The state machine enables scan access to scan path C by; (1) enabling SCANCK gate 710 via signal 728, and (2) enabling buffer 516 via signal 722. While scan path C is being accessed, the state machine operates counter 704 via control signals 730 to determine the number of SCANCK-C's to output to scan path C. When the counter reaches a count, indicative of scan path C receiving the correct number (M/3) SCANCK-C inputs, it outputs a third count complete 1 (CC1) signal 732 to state machine 702.

In response to the third CC1 signal, the state machine disables all buffers 512–516 via signals 718–722 and enables gates 706–710 to pass the SCANCK to all scan cells of scan paths A, B, and C. Since scan paths A, B, and C were assumed to contain equal numbers of scan cells (M/3) with the sum of the scan cells in scan paths A, B, and C being equal to the number of scan cells (M) in scan path 104, the third CC1 signal occurs one SCANCK prior to controller 110 setting the SCANENA signal high, at time 814, during its transition from the operate state 304 to the capture state 306 in FIG. 6. While SCANENA is high, at time 808, all scan paths A, B, and C receive a SCANCK, causing them to load response data from logic 108 of FIG. 5. Following the response data load operation at time 808, SCANENA from controller 110 returns low at time 812 and the above described sequence of separately accessing scan paths A, B, and C repeats until the test completes and controller 110 transitions back to idle state 302 of FIG. 6.

Figure 4:
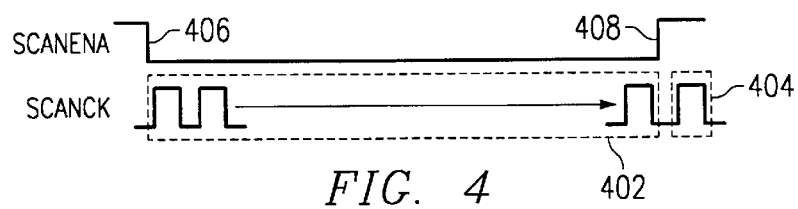
FIG. 4 is a timing diagram of the operation of the circuit of FIG. 1.
Figure 8:
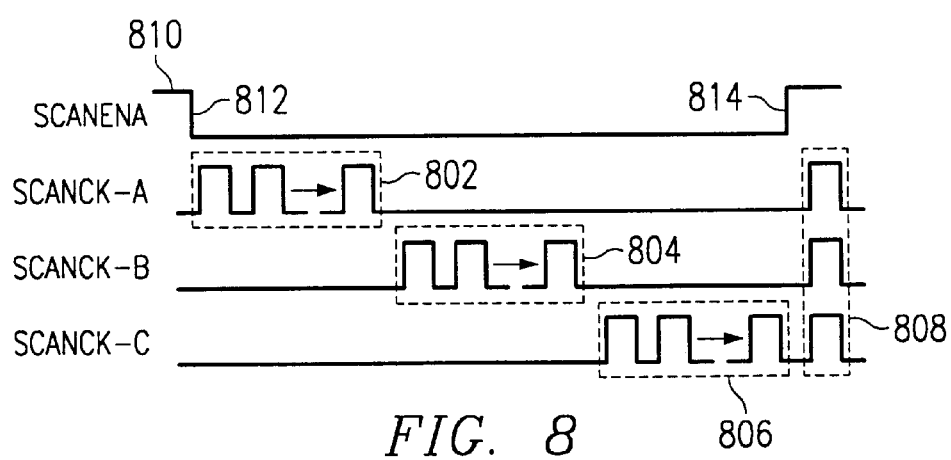
FIG. 8 is a timing diagram for the operation of the adaptor of FIG. 7.

Contrasting the scan timing diagrams of FIGS. 4 and 8, it is seen that controller 110 provides the same SCANENA timing for both diagrams. For example, (1) the SCANENA high to low transition at time 406 in FIG. 4 is the same SCANENA high to low transition at time 812 in FIG. 8, (2) the SCANENA low to high transition at time 408 in FIG. 4 is the same SCANENA low to high transition at time 814 in FIG. 8, (3) the same number of SCANCKs occur between time 406/812 and time 408/814 in both diagrams, and (4) the same response load SCANCK occurs at time 404 in FIG. 4 and at time 808 in FIG. 8. The difference between the two timing diagrams is seen in the way the adaptor 504 sequentially applies a burst of M/3 SCANCKs to scan paths A, B, and C during time intervals 802, 804, and 806, respectively, such that only one of the scan paths is accessed at a time.

While the example adaptor circuit of FIG. 7 has been described using a gated clocking scheme to control access to the scan cells 200 of scan paths A, B, and C, other example designs of adaptor 504 may be used to control access to other types of scan cells used in scan paths A, B, and C as well. For example, the scan cells 200 of FIG. 2 could be designed to include a state hold multiplexer 218 between the output of multiplexer 202 and input to D-FF 204. The state hold multiplexer 218 could be controlled, via a connection 220 to the ENACK-A 724, ENACK-B 726, and ENACK-C 728 signals from state machine 702, such that it provides a connection 222 between the output of multiplexer 202 and the D-FF input, or it provides a state hold connection 224 between the output of DFF 204 and the input to D-FF 204. If this type of scan cell 200 were used in scan paths A, B, and C, the SCANCK 212 could be directly routed to all the D-FF 204 clock inputs instead of being gated to the D-FF 204 clock inputs via the SCANCK-A, SCANCK-B, and SCANCK-C signals as described for adaptor 504 of FIG. 7. The adaptor 504 would be modified to operate the state holding scan cells by eliminating the gates 706–710 and the SCANCK-A, SCANCK-B, and SCANCK-C outputs, and providing as outputs the ENACK-A 724, ENACK-B 726, and ENACK-C 728 signals from state machine 702. The ENACK-A output would be connected as control input 220 to the state hold multiplexers 218 in the scan cells of scan path A. The ENACK-B output would be connected as control input 220 to the state hold multiplexers 218 in the scan cells of scan path B. The ENACK-C output would be connected as control input 220 to the state hold multiplexers 218 in the scan cells of scan path C.

During functional and response capture operations, the ENACK-A, ENACK-B, and ENACK-C outputs from the modified adaptor 504 would be set to enable a connection between the response signal 206 and input to D-FF 204 of each scan cell, via multiplexer 202 and the state hold multiplexer 218. During scan operations to scan path A (timing interval 802), the ENACK-B and ENACK-C outputs would be set to place the scan cells of scan paths B and C in their state hold connection configuration, and ENACK-A would be set to form a connection between the scan input 208 and input to D-FF 204 of the scan cells in scan paths A, to allow scan access of scan path A. During scan operations to scan path B (timing interval 804), the ENACK-A and ENACK-C outputs would be set to place the scan cells of scan paths A and C in their state hold connection configuration, and ENACK-B would be set to form a connection between the scan input 208 and input to D-FF 204 of the scan cells in scan paths B, to allow scan access of scan path B. During scan operations to scan path C (timing interval 806), the ENACK-A and ENACK-B outputs would be set to place the scan cells of scan paths A and B in their state hold connection configuration, and ENACK-C would be set to form a connection between the scan input 208 and input to D-FF 204 of the scan cells in scan paths C, to allow scan access of scan path C.

The modified adaptor 504 and state hold type scan cells described above operate to achieve the low power mode of scan access to scan paths A, B, and C as previously described with the original adaptor 504 and scan cell 200. The difference between the two adaptor/scan cell combinations described above is that the original adaptor/scan cell combination operates in a gated clock mode (i.e. uses gated clocks SCANCK-A, SCANCK-B, and SCANCK-C) and the modified adaptor/scan cell combination operates in a synchronous clock mode C (i.e. uses the SCANCK).

Scan Path Adaptation

As mentioned previously, test synthesis tools exist that are capable of automatically instantiating Scan-BIST architectures similar to the one shown in FIG. 1. These tools are capable of analyzing logic 108 and its stimulus and response interface to scan path 104 to determine; (1) what stimulus data needs to be produced by generator 102 and applied to logic 108 via scan path 104, (2) what test signature is expected to be obtained by compactor 106 from the response output from scan path 106, and (3) what type of controller 110 is required to orchestrate the communication of stimulus data to and response data from logic 108 via scan path 104. From the analysis, the tool creates the appropriate controller 110, generator 102, and compactor 106 circuits and connects them to the scan path 104 as seen in FIG. 1. To reduce the effort required to adapt the synthesized Scan-BIST architecture of FIG. 1 into the low power Scan-BIST architecture of FIG. 5, the scan path adaptation process described below is preferably performed.

Figure 9:
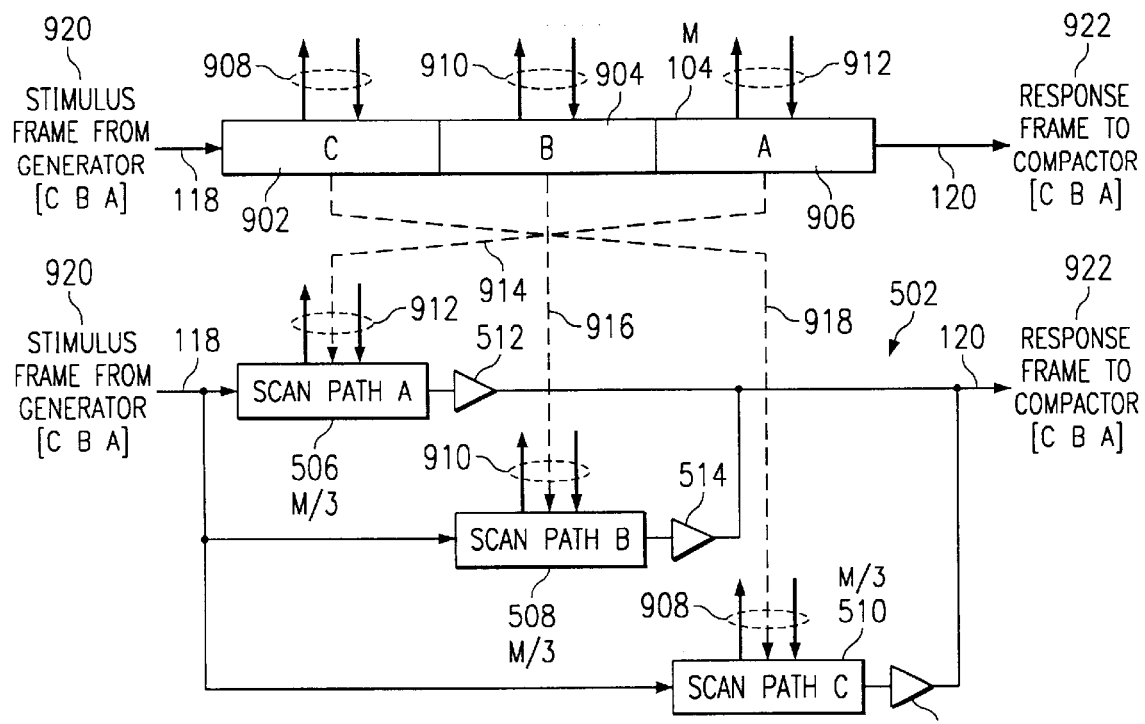
FIG. 9 is a block diagram of the scan paths arranged according to the present invention.

In FIG. 9, scan path 104 is shown receiving stimulus frames 920 from generator 102 via connection 118 and outputting response frames 922 to compactor 106 via connection 120. The term "frame" simply indicates the number of scan bits (M) required to fill the scan path 104 with stimulus data from generator 102 and empty the scan path 104 of response data to compactor 106 during the operate state 304 of FIG. 3. The test may require a large number of stimulus and response frame communications to test logic 108. To achieve the low power mode of operation of the present invention, it is desired to reorganize scan path 104 into a plurality of separate scan paths. In this example, the reorganization of scan path 104 results in the previously described scan path 502, which contains three separate scan paths 506–510. It is also desired to adapt scan path 104 into scan path 502 in such a way as to avoid having to make any modifications to the synthesized generator 102, compactor 106, or controller 110.

As previously mentioned in regard to FIG. 5, the number (M) of scan cells in scan path 104, is assumed divisible by three such that scan path 104 can be seen to comprise three separate scan segments A, B, and C, each scan segment containing a third (M/3) of the scan cells (M) in scan path 104. Scan segment A of 104 contains a subset 912 of the stimulus and response signals of the overall stimulus and response busses 122 and 124 respectively. Scan segment B of 104 contains a subset 910 of the stimulus and response signals of the overall stimulus and response busses 122 and 124 respectively. Scan segment C of 104 contains a subset 908 of the stimulus and response signals of the overall stimulus and response busses 122 and 124 respectively.

Each stimulus scan frame 920 scanned into scan path 104 from generator 102 can be viewed as having bit position fields [CBA] that fill scan segments C, B, and A, respectively. For example, following a scan operation, bit position field A is loaded into segment A, bit position field B is loaded into segment B, and bit position field C is loaded into segment C. Likewise, each response scan frame 922 scanned from scan path 104 to compactor 106 can be viewed as having bit position fields [CBA] that empty scan segments C, B, and A, respectively. For example, following a scan operation, bit position field A is unloaded from segment A, bit position field B is unloaded from segment B, and bit position field C is unloaded from segment C. To insure that the stimulus 920 and response 922 frames from generator 102 and to compactor 106, respectively, are reusable when scan path 104 is reorganized into the low power configuration, the reorganization process occurs as described below.

Scan path 104 segment A is configured as a separate scan path A 506, as indicated by the dotted line 914. Scan path 104 segment B is configured as a separate scan path B 508, as indicated by the dotted line 916. Scan path 104 segment C is configured as a separate scan path C 510, as indicated by the dotted line 918. The scan inputs to scan paths A, B, and C 506–510 are connected to generator 102 via connection 118. The scan outputs from scan paths A, B, and C 506–510 are connected, via the previously described 3-state buffers 512–516, to compactor 106 via connection 120. Each separate scan path 506–510 maintains the same stimulus and response bussing connections 908–912 to logic 108.

Operating the reorganized scan path 502 using the same generator 102 and compactor 106 circuits used to operate scan path 104 results in the following behavior. This behavior assumes adaptor 504 has been inserted between the controller 110 and scan path 502, to control scan path 502 as described in FIGS. 5, 6, 7, and 8. During input and output of stimulus and response frames [CBA] 920 and 922 respectively, (1) stimulus bit field A is directly loaded into scan path A from generator 102 as response bit field A is directly unloaded from scan path A to compactor 106, (2) stimulus bit field B is directly loaded into scan path B from generator 102 as response bit field B is directly unloaded from scan path B to compactor 106, and (3) stimulus bit field C is directly loaded into scan path C from generator 102 as response bit field C is directly unloaded from scan path C to compactor 106. As seen from this description, when scan path 104 is reorganized into scan path 502 as described, scan path 502 can use the same stimulus and response frames originally intended for use by scan path 104. Thus no modifications are necessary to the synthesized generator 102, compactor 106, or controller 110 circuits.

In the case where scan path 104 contains a number of scan cells (M) that is not equally divisible by the desired number of separate scan paths (N) in scan path 502, the length of one of the separate scan paths can be adjusted to compensate scan path 502 for proper input and output of the scan frames 920 and 922. For example, if the number of scan cells (M) in scan path 104 is not equally divisible by the number of separate scan paths (N) required to achieve a desired low power mode of operation, M can be increased by adding a value (Y) such that M+Y is equally divisible by N. Once this is done, N separate scan paths may be formed. N−1 of the separate scan paths will have a length (M+Y)/N and one of the separate scan paths will have a length of ((M+Y)/N)−Y. For example, if scan path 104 had 97 scan cells (M), scan path A and B of 502 would each be configured to contain 33 scan cells [(M+Y)/N=(97+2)/3=33], while scan path C would be configured to contain 31 scan cells [((M+Y)/N)−Y=((97+2)/3)−2=31]. In this example, the scan frame 920 and 922 [CBA] segments would be seen as; segment A=33 bits, segment B=33 bits, and segment C=31 bits.

When scan path 502 is formed to include the scan frame compensation technique described above, the operation of adaptor 504 is adjusted so it can properly control the compensated scan path 502. In FIGS. 7 and 8, the adaptor 504 circuit and operation was described in detail. Assuming the adaptor timing diagram in FIG. 8 is being used to communicate scan frames to a scan path 502 consisting of the above mentioned 33-bit scan path A, 33-bit scan path B, and 31-bit scan path C, the following changes are required to adaptor 504. Adaptor state machine 702 continues to monitor the CC1 732 output from counter 704, as previously described, to determine when to stop 33-bit scan operations to scan paths A and B at timing intervals 802 and 804, respectively, in FIG. 8. However, since the scan timing interval 806 to scan path C is different from the scan timing intervals 802 and 804, the state machine operation is altered to where it monitors the count complete 2 (CC2) output 734 from counter 704 to stop the 31-bit scan operation to scan path C. The CC2 734 output is designed to indicate when the 31-bit scan operation to scan path C should be stopped, whereas the CC1 732 is designed to indicate when the 33-bit scan operation to scan paths A and B should be stopped.

Parallel Scan-BIST Architectures

Figure 10:
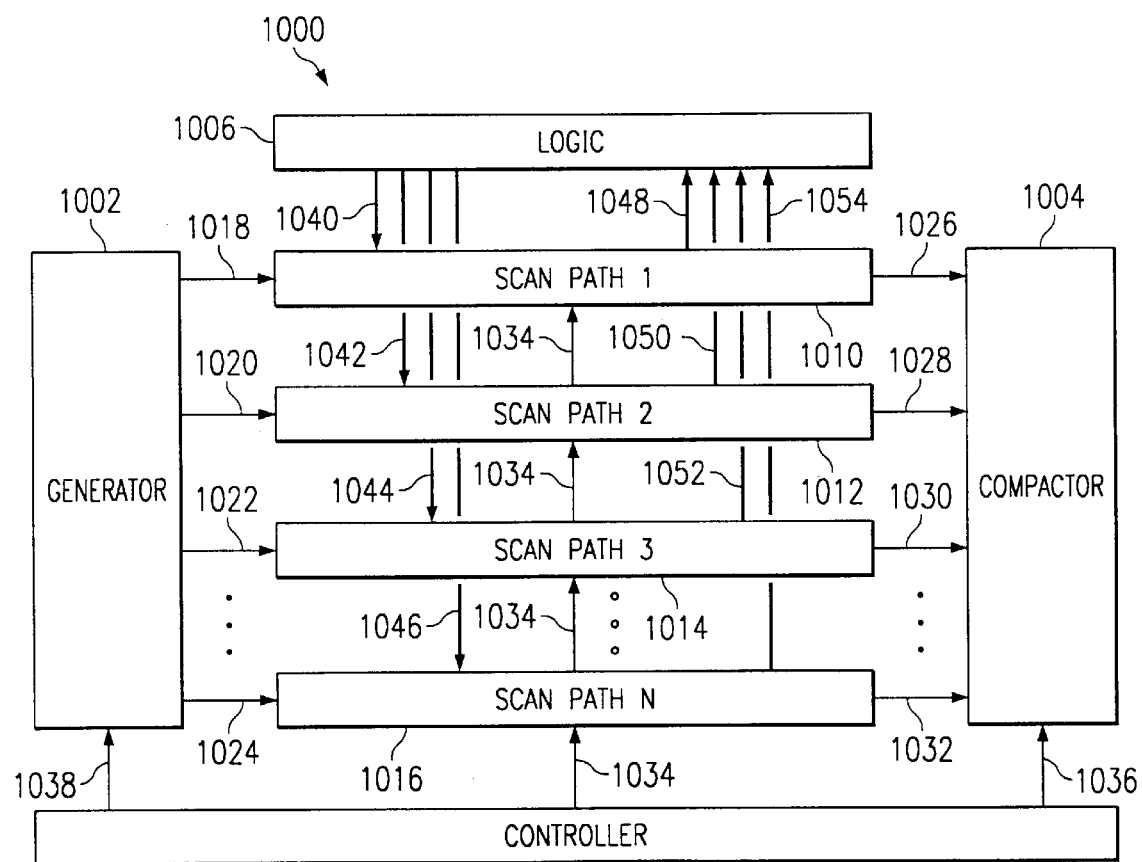
FIG. 10 is a block diagram of a SCAN-BIST circuit using a conventional parallel scan architecture.

FIG. 10 illustrates circuit 1000 that has been configured for testing using a conventional parallel Scan-BIST architecture. As with the previous single Scan-BIST architecture of FIG. 1, parallel Scan-BIST architectures may be synthesized and automatically inserted into ICs to serve as embedded testing mechanisms. The parallel Scan-BIST architecture includes; generator 1002, compactor 1004, controller 1008, and scan paths 1–N 1010–1016. During functional mode of circuit 1000, the D-FFs 204 of scan paths 1–N are configured to operate with logic 1006 to provide the circuit 1000 functionality. During test mode, the D-FFs 204 of scan path 1–N are configured to operate with generator 1002, compactor 1004, and controller 1008 to provide testing of logic 1006. Scan paths 1–N receive response from logic 1006 via paths 1040–1046, and output stimulus to logic 1006 via paths 1048–1054. Scan paths 1–N receive serial stimulus from generator 1002 via paths 1018–1024, and output serial response to compactor 1004 via paths 1026–1032. Scan paths 1–N receive control input from controller 1008 via path 1034, generator 1002 receives control input from controller 1008 via path 1038, and compactor 1004 receives control input from controller 1008 via path 1036.

Figure 11:
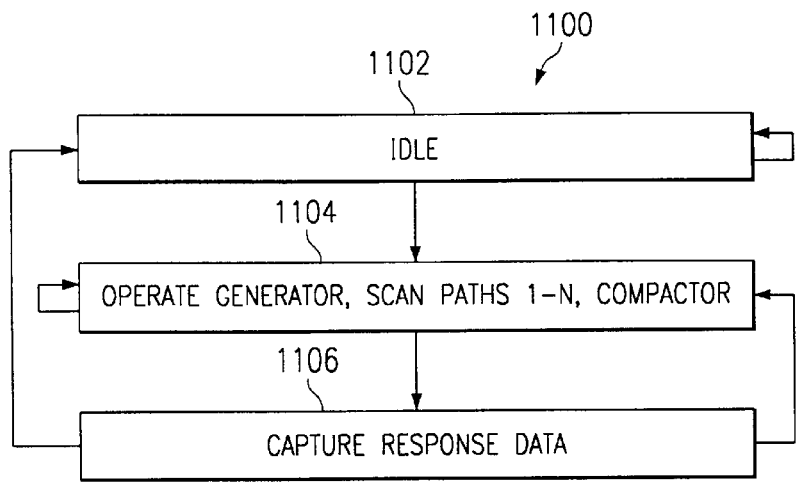
FIG. 11 is a flow chart for the operation of the parallel scan path of FIG. 10.

When circuit 1000 is first placed in the test configuration of FIG. 10, the parallel Scan-BIST architecture will be in the idle state 1102 of the operation diagram 1100 in FIG. 11. In response to a start test signal, as previously described in regard to FIG. 1, the parallel Scan-BIST architecture transitions from the idle state 1102 to the operate state 1104. In the operate state, controller 1008 outputs control to generator 1002, scan paths 1–N, and compactor 1004 to start the test. During the operate state, scan paths 1–N are filled with stimulus to be input to logic 1006 from generator 1002 and emptied of response from logic 1006 to compactor 1004. After the scan paths 1–N are filled and emptied, controller 1008 transitions to the capture state 1106 to load the next response data, then returns to the operate state 1104 to input the next stimulus from generator 1002 and empty the next response to compactor 1004. After all stimulus and response patterns have been applied, by repeating transitions between the operate and capture states, the test is complete and the controller returns to the idle state 1102.

The structure and operation of the parallel Scan-BIST architecture of FIG. 10 is very similar to the structure and operation of the single Scan-BIST architecture of FIG. 1. Some of the most notable differences between the Scan-BIST architectures of FIGS. 1 and 10 include. (1) In FIG. 10, multiple parallel scan paths 1–N are formed during the test configuration, as opposed to the single scan path 104 formed during the FIG. 1 test configuration. (2) In FIG. 10, generator 1002 outputs multiple parallel stimulus outputs 1018–1024 to scan paths 1–N, as opposed to generator 102 outputting a single stimulus output 118 to scan path 104. (3) In FIG. 10, compactor 1004 inputs multiple parallel response outputs 1026–1032 from scan paths 1–N, as opposed to compactor 106 inputting a single response output 120 from scan path 104.

The parallel Scan-BIST architecture of FIG. 10 suffers from the same power consumption problem described in the Scan-BIST architecture of FIG. 1, since during scan operations, logic 1006 receives simultaneous rippling stimulus inputs from scan paths 1–N. Thus, the parallel Scan-BIST architecture of FIG. 10 can be improved to where it consumes less power during test by adapting it into a low power parallel Scan-BIST architecture as described below.

Low Power Parallel Scan-BIST Architecture

Figure 12:
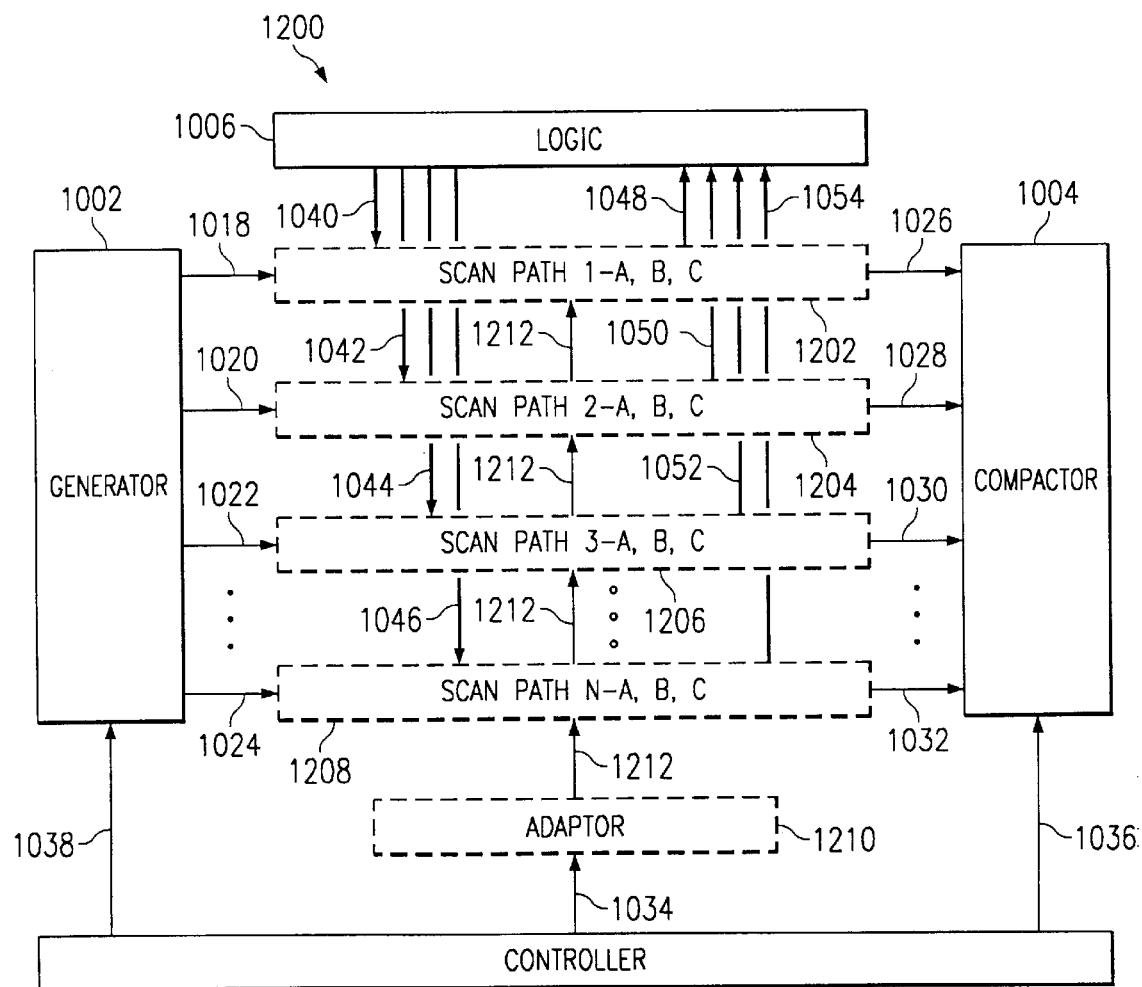
FIG. 12 is a block diagram of a SCAN-BIST parallel scan path arranged according to the present invention.

FIG. 12 illustrates the FIG. 10 parallel Scan-BIST architecture after it has been adapted for low power operation. The adaptation process, as previously described in the low power adaptation of the FIG. 1 Scan-BIST architecture, involves the following steps. Step one includes reconfiguring scan paths 1–N 1010–1016 of FIG. 10 into scan paths 1–N 1202–1208 of FIG. 12, wherein each scan path 1–N 1202–1208 contains multiple separate scan paths between their respective inputs 1018–1024 and outputs 1026–1032. In this example, it is assumed that each scan path 1–N 1202–1208 has been reconfigured into separate scan paths A, B, and C, as scan path 104 of FIG. 1 was reconfigured into scan path 502 of FIG. 5. Step two includes inserting adaptor 1210 between controller 1008 and scan paths 1–N 1202–1208. In this example, it is assumed that adaptor 1210 is very similar to adaptor 504 in the way it operates the separate scan paths A, B, and C in each of the scan paths 1–N 1202–1208, so only the brief operation description of adaptor 1210 is given below.

Figure 13:
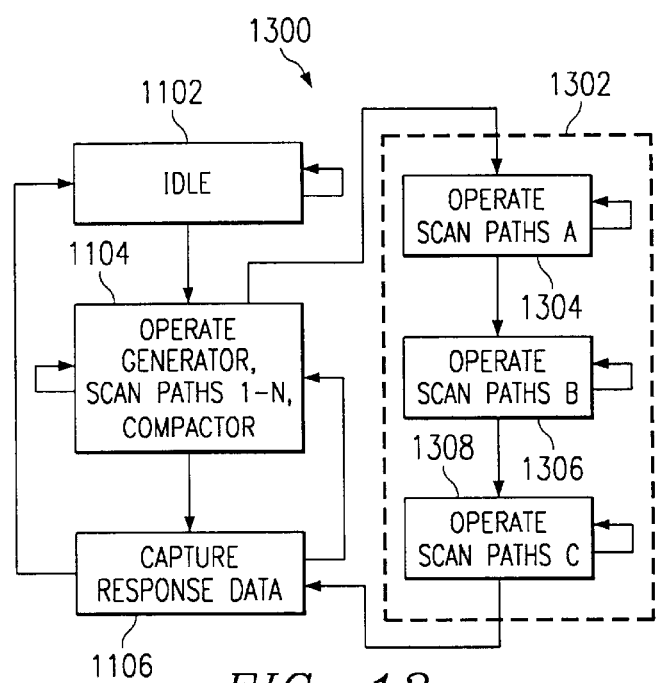
FIG. 13 is a flow chart of the operation of the circuit of FIG. 12.

As seen in the operation diagram of FIG. 13, adaptor 1210 responds to controller 1008 entering the operate state 1104 to: (1) simultaneously operate the scan paths A of scan paths 1202–1208, via control bus 1212, to input stimulus from generator 1002 and output response to compactor 1004, then (2) simultaneously operate the scan paths B of scan paths 1202–1208, via control bus 1212, to input stimulus from generator 1002 and output response to compactor 1004, then (3) simultaneously operate the scan paths C of scan paths 1202–1208, via control bus 1212, to input stimulus from generator 1002 and output response to compactor 1004. Adaptor 1210 suspends scan operations to scan paths 1202–1208 when controller enters the capture state 1106, and resumes the above described scan operation sequence to the scan paths A, B, and C of scan paths 1202–1208 when controller re-enters the operate state 1104. After the test completes, controller 1008 enters the idle state 1102 and the adaptor 1210 is disabled. From this description, the operation of adaptor 1210 is seen to mirror the operation of adaptor 504 with the exception that adaptor 1210 controls multiple scan paths A, multiple scan paths B, and multiple scan paths C during its control state diagram sequence 1302. In contrast, adaptor 504 controlled only one scan path A, one scan path B, and one scan path C during its control state diagram sequence 602.

Direct Synthesis of Low Power Scan-BIST Architectures

While the process of adapting pre-existing Scan-BIST architectures for low power operation has been described, it is anticipated that, once the low power benefit of the present invention is understood, test synthesis tools will be improved to provide direct synthesis of low power Scan-BIST architectures. Direct synthesis of low power Scan-BIST architectures will eliminate the need to perform the adaptation steps previously described, since the steps will be incorporated into the synthesis process. The following examples describe the low power Scan-BIST architecture concepts of the present invention as they may be included in synthesized low power Scan-BIST architectures of FIGS. 14 and 16.

Figure 15:
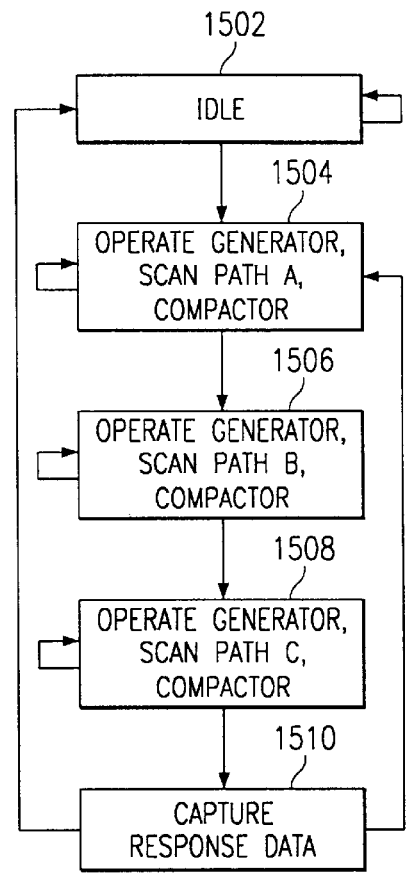
FIG. 15 is a flow chart of the operation of the circuit of FIG. 14.
Figure 14:
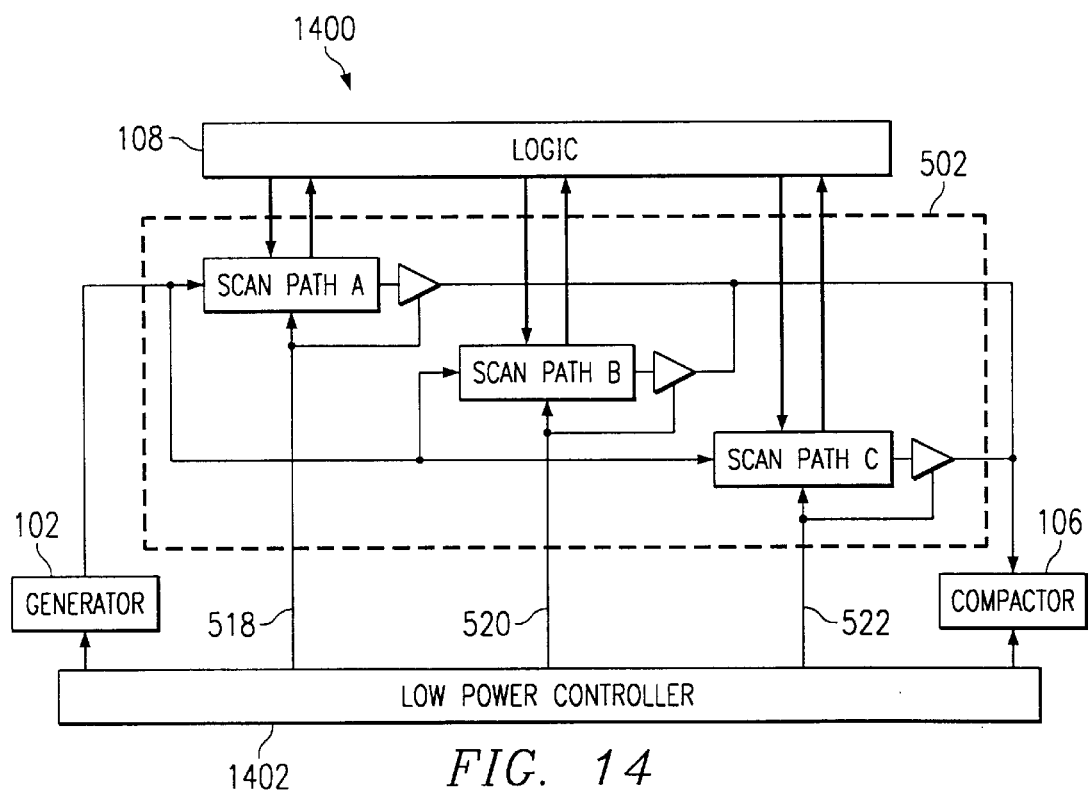
FIG. 14 is a block diagram of another SCAN-BIST parallel scan path circuit with the adaptor incorporated in the low cost controller.

FIG. 14 illustrates an example synthesis of a single scan path low power Scan-BIST architecture. The previously described adaptation step of reconfiguring scan path 104 into scan path 502 is shown being included in the synthesis of the Scan-BIST architecture. The previously described adaptation step of providing control operable to separately access scan paths A, B, and C of scan path 502 is also shown being included in the synthesis of the Scan-BIST architecture. The synthesized low power controller 1402 integrates the control features of the previously described controller 110 and adaptor 504 of FIG. 5 into a single control circuit. Controller 1402 operates according to the controller state diagram of FIG. 15, which includes an idle state 1502 corresponding to idle state 302 of FIG. 6, operate states 1504–1508 corresponding to operate states 304 and 604–608 of FIG. 6, and a capture state 1510 corresponding to capture state 306 of FIG. 6.

Figure 16:
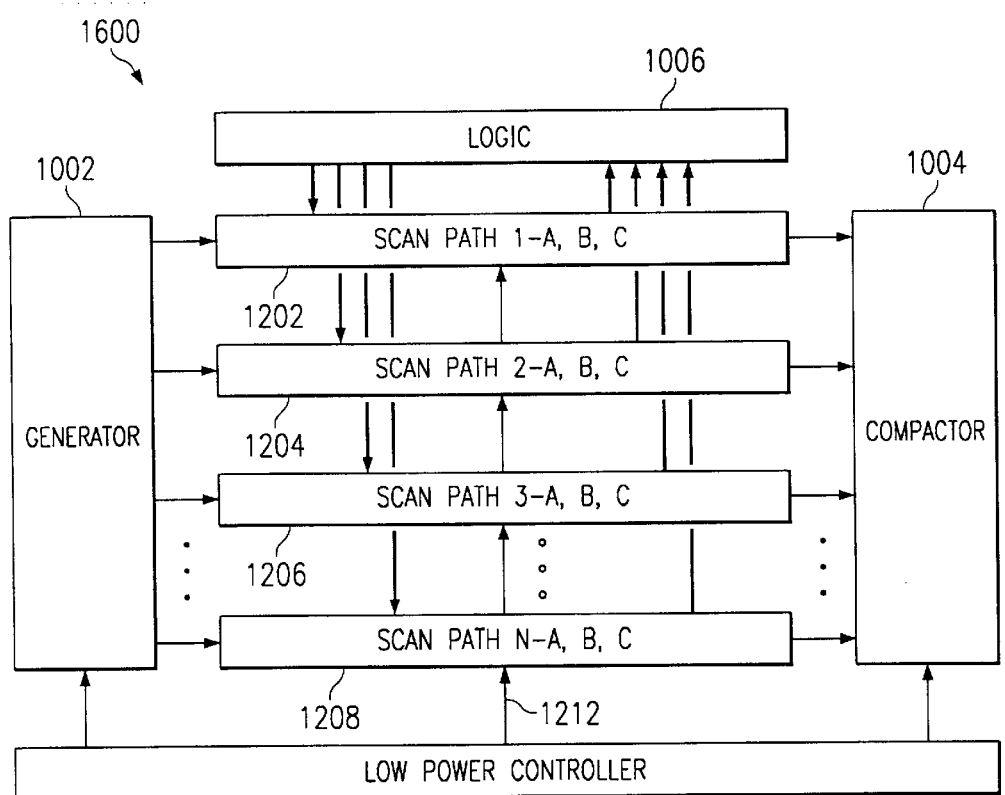
FIG. 16 is a block diagram of the circuit of FIG. 14 according to the present invention.
Figure 17:
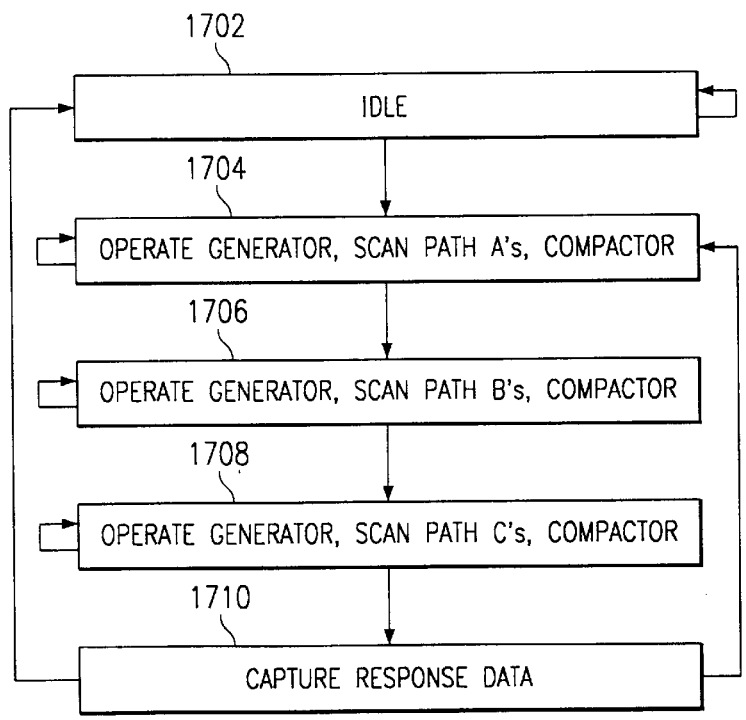
FIG. 17 is a flow chart of the operation of the circuit of FIG. 16.

FIG. 16 illustrates an example synthesis of a parallel scan path low power Scan-BIST architecture. The previously described adaptation step of reconfiguring scan paths 1010–1016 into scan paths 1202–1208 is shown being included in the synthesis of the Scan-BIST architecture. The previously described adaptation step of providing control operable to separately access scan paths A, B, and C of scan paths 1202–1208 is also shown being included in the synthesis of the Scan-BIST architecture. The synthesized low power controller 1602 integrates the control features of the previously described controller 1008 and adaptor 1210 of FIG. 12 into a single control circuit. Controller 1602 operates according to the controller state diagram of FIG. 17, which includes an idle state 1702 corresponding to idle state 1102 of FIG. 13, operate states 1704–1708 corresponding to operate states 1104 and 1304–1308 of FIG. 13, and a capture state 1710 corresponding to capture state 1106 of FIG. 13.

Scalable Scan-BIST Power Consumption

As can be anticipated from the description given for the present invention, the power consumption of logic circuitry being tested by the low power scan-BIST architecture decreases as the number separate scan paths within the low power scan paths increases. For example, configuring a given conventional scan path into a low power scan path comprising two separate scan paths may reduce power consumption by up to 50%, since, during operation, each of the two separate scan paths separately charge and discharge one half, potentially, of the logic circuitry capacitance charged and discharged by the convention scan path. Further, configuring the same conventional scan path into a low power scan path comprising three separate scan paths may reduce power consumption by up to 66%, since, during operation, each of the three separate scan paths separately charge and discharge one third, potentially, of the logic capacitance charged and discharged by the convention scan path. Still further, configuring the same conventional scan path into a low power scan path comprising four separate scan paths may reduce power consumption by up to 75%, since, during operation, each of the four separate scan paths separately charge and discharge one fourth, potentially, the logic capacitance charged and discharged by the convention scan path. From this it is seen that the present invention allows a synthesis tool to be provided with the capability of scaling the power consumption of a given synthesized scan-BIST architecture to meet a desired low power mode of test operation of a circuit.

Scalable Scan-BIST Noise Reduction

As can be anticipated from the description given for the present invention, the noise generated by logic circuitry being tested by the low power scan-BIST architecture decreases as the number separate scan paths within the low power scan paths increases. For example, configuring a given conventional scan path into a low power scan path comprising two separate scan paths may reduce noise generation by up to 50%, since, during operation, each of the two separate scan paths separately activate only one half, potentially, of the logic circuitry activated by the conventional scan path. Further, configuring the same conventional scan path into a low power scan path comprising three separate scan paths may reduce noise generation by up to 66%, since, during operation, each of the three separate scan paths separately activate only one third, potentially, of the logic circuitry activated by the convention scan path. Still further, configuring the same conventional scan path into a low power scan path comprising four separate scan paths may reduce noise generation by up to 75%, since, during operation, each of the four separate scan paths separately activate one fourth, potentially, of the logic circuitry activated by the convention scan path. From this it is seen that the present invention allows a synthesis tool to be provided with the capability of scaling the noise generation of a given synthesized scan-BIST architecture to meet a desired low noise mode of test operation of a circuit.

Although the present invention has been described in accordance to the embodiments shown in the figures, one of ordinary skill in the art will recognize there could be variations to these embodiments and those variations should be within the spirit and scope of the present invention. Accordingly, modifications may be made by one ordinarily skilled in the art without departing from the spirit and scope of the appended claims.

I claim:

1. A scan circuit comprising:
  A. a functional circuit formed on the semiconductor substrate of an integrated circuit, the functional circuit including logic circuits to be tested;
  B. a scan path circuit formed of serially connected scan cells, the scan path circuit having leads connected to the logic circuits to carry stimulus signals to the logic circuits and to receive response signals from the logic circuits, the scan path circuit having a serial data input lead and a serial data output lead, the scan path circuit having control input leads for receiving control signals to control operation of the scan path circuit, the scan path circuit being organized in selectable, separate scan path parts, each scan path part having a serial input connected to the serial data input lead, a serial output lead selectively coupled to the serial data output lead and a separate set of control input leads;
  C. a test data generator circuit having control inputs and a serial data output connected to the serial data input lead of the scan path circuit;
  D. a test data compactor circuit having control inputs and a serial data input connected to the serial data output lead of the scan path circuit;
  E. a controller having control output leads connected to the control inputs of the generator circuit and to the control inputs of the compactor circuit, and coupled to the control inputs of the scan path circuit; and
  F. adaptor circuits coupling the control output leads of the controller to the separate sets of control input leads of the scan path circuit, the adaptor circuits including input leads receiving one set of control signals from the controller and including a set of output leads providing control signals for each scan path part, the adaptor circuits including a state machine controlling the production of the separate sets of control signals for operating the respective separate scan path parts, and the adaptor circuits including counter circuits connected to the state machine.

2. The circuit of claim 1 in which the state machine has counter control outputs and at least one count input, and the counter has control inputs connected to the counter control outputs and has at least one count output connected to the count input.

3. The circuit of claim 1 in which the scan path parts have equal numbers of scan cells and there is only one count input and one count output.

4. The circuit of claim 1 in which the scan paths have unequal numbers of scan cells and there are plural count outputs.

5. The circuit of claim 1 in which the state machine has a scan clock input, a scan enable input, an enable clock output for each scan path part, and an enable buffer output for each scan path part, the adaptor circuits including a gate for each scan path part, each gate having a first input connected to an enable clock output from the state machine and the scan clock input.

* * * * *